United States Patent
Sanzone et al.

(10) Patent No.: US 9,012,765 B2
(45) Date of Patent: Apr. 21, 2015

(54) REFLECTIVE DEVICE FOR A PHOTOVOLTAIC MODULE WITH BIFACIAL CELLS

(75) Inventors: Vincenzo Sanzone, Chapareillan (FR); Eric Gerritsen, Bernin (FR); Philippe Thony, Entre-Deux-Guiers (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 477 days.

(21) Appl. No.: 13/512,002

(22) PCT Filed: Dec. 10, 2010

(86) PCT No.: PCT/FR2010/052664
§ 371 (c)(1),
(2), (4) Date: May 24, 2012

(87) PCT Pub. No.: WO2011/080442
PCT Pub. Date: Jul. 7, 2011

(65) Prior Publication Data
US 2012/0247533 A1 Oct. 4, 2012

(30) Foreign Application Priority Data
Dec. 14, 2009 (FR) ...................................... 09 58914

(51) Int. Cl.
*H01L 31/042* (2014.01)
*H01L 31/054* (2014.01)
*H01L 31/068* (2012.01)

(52) U.S. Cl.
CPC ......... *H01L 31/0547* (2014.12); *H01L 31/0684* (2013.01); *Y02E 10/52* (2013.01); *H01L 31/054* (2014.12)

(58) Field of Classification Search
CPC ........................ H01L 31/0547; H01L 31/0684
USPC ................................... 136/246, 259
See application file for complete search history.

(56) References Cited

U.S. PATENT DOCUMENTS 4,153,476 A * 5/1979 Frosch et al. ................. 136/246
5,994,641 A 11/1999 Kardauskas
(Continued)

FOREIGN PATENT DOCUMENTS

WO        WO-0245143 A1     6/2002

OTHER PUBLICATIONS

International Search Report for PCT/FR10/52664 mailed Mar. 29, 2012 (6 pages).

*Primary Examiner* — Allison Bourke
(74) *Attorney, Agent, or Firm* — Harris Beach PLLC

(57) ABSTRACT

The invention relates to a reflective device for a photovoltaic module formed by a plurality of bifacial photovoltaic cells or rows of said cells spaced apart from one another, each cell having an active front face and an active rear face that can capture photons from incident light rays falling on the front and rear faces. The device comprises at least one reflective module to be placed under the cells substantially in line with the gap(s) separating two adjacent cells or two rows of adjacent cells. The reflective module comprises: a first portion, of which the surfaces that are oriented towards the gap have a first curvature such as to send all or part of the incident photons towards the rear face of the cells; and a second portion mounted on the first portion, of which the surfaces oriented towards the gap have a second curvature such as to send all or part of the incident photons towards the rear face of the cells, the second curvature being different from the first curvature.

8 Claims, 3 Drawing Sheets

(56) References Cited

U.S. PATENT DOCUMENTS

| | | | |
|---|---|---|---|
| 6,294,723 B2 * | 9/2001 | Uematsu et al. | 136/246 |
| 6,410,843 B1 | 6/2002 | Kishi et al. | |
| 7,259,322 B2 * | 8/2007 | Gronet | 136/246 |
| 2001/0008144 A1 | 7/2001 | Uematsu et al. | |
| 2005/0272225 A1 * | 12/2005 | Weber et al. | 438/460 |
| 2006/0272698 A1 | 12/2006 | Durvasula | |
| 2009/0014055 A1 * | 1/2009 | Beck et al. | 136/246 |
| 2010/0307565 A1 * | 12/2010 | Suga | 136/246 |

* cited by examiner

AXIS AA'
Prior Art

REFLECTIVE DEVICE FOR A PHOTOVOLTAIC MODULE WITH BIFACIAL CELLS

CROSS-REFERENCE TO RELATED APPLICATIONS

This application is a national stage application under 35 U.S.C. §371 of PCT Application No. PCT/FR2010/52664, filed Dec. 10, 2010, which claims priority to and the benefit of French Patent Application No. 0958914, filed Dec. 14, 2009, which is incorporated herein by reference in its entirety.

TECHNICAL FIELD

The invention falls within the field of energy production using photovoltaic cells. It relates more specifically to optimising photon capture by said cells. To this end, it relates to a reflective device for a photovoltaic module with bifacial cells that can direct photon fluxes towards the rear face of said cells.

BACKGROUND OF THE INVENTION

Generally speaking and with reference to FIGS. 1 and 2, a photovoltaic module 1 is formed by a plurality of bifacial solar cells 2, each having an active front face 20 and an active rear face 21, that can capture and convert to electrical energy photons from an incident light radiation falling on said front and rear faces. These cells are spaced apart from one another within a structure 3 formed by a front plate 30 transparent to incident radiation and placed opposite the front faces 20, a rear plate 31, transparent to said radiation, and placed opposite the rear faces 21, and a frame 32 for sealing the assembly in order to improve resistance and seal the structure.

Since the electrical power generated by the photovoltaic module depends in particular on the incident light flux, these photovoltaic modules are generally placed on roofs or as a replacement for the roof, to benefit from maximum brightness. The front plate of the structure is thus preferably made from a transparent material that has a high light transmission coefficient and is impact and weather resistant.

Furthermore, since the cells are arranged to be spaced apart from one another, photons may pass through the structure via the gaps separating adjacent cells, without interacting with the cells. Capturing these lost photons to send them back towards the active rear faces of the cells constitutes a solution for improving capture, and hence photovoltaic module efficiency. To do so, a reflecting plate may be placed opposite the rear faces of the cells. The surface of this reflecting plate is in particular provided with reflective means such as mirrors, or refractive means such as prisms or lenses.

For example, document U.S. Pat. No. 6,410,843 proposes the use of a continuous reflecting plate, i.e. with dimensions equal to those of the rear plate of the structure, the surface of which has rough patches in the form of continuously alternating bumps and hollows, in order to capture the lost photons and send them back towards the rear faces of the cells.

Likewise, document U.S. Pat. No. 5,994,641 proposes covering the surface of the reflecting plate with a textured film having raised parts arranged opposite the gaps separating adjacent cells, each raised part having a different orientation depending on its position relative to the cells.

Although these solutions do allow the lost photons to be sent back towards the rear face of the cells, the assembly formed by the photovoltaic module and the reflecting plate is bulky, cumbersome, fragile, expensive and not optimised.

In this context, the purpose of this invention is to propose another reflective device that is free from at least one of the previously mentioned limitations. The particular purpose of the invention is to improve the efficiency of a photovoltaic module, by proposing a solution that can optimise the capture of the lost photons and the return thereof towards the active rear face of the cells. A further purpose of the invention is to propose a less expensive and less cumbersome solution.

DISCLOSURE OF THE INVENTION

To this end the invention relates to a reflective device for a photovoltaic module formed by a plurality of bifacial photovoltaic cells spaced apart from one another, each cell having an active front face and an active rear face that can capture photons from incident light rays falling on said front and rear faces.

According to the invention, the reflective device comprises at least one reflective module to be placed under the cells substantially in line with the gaps separating the adjacent cells, the reflective module comprising:

a first portion of which the surfaces facing the gap separating the cells have a first curvature such as to send all or part of the incident photons towards the rear face of the cells; and a second portion mounted on the first portion, of which the surfaces facing the gap have a second curvature such as to send all or part of the incident photons towards the rear face of the cells, the second curvature being different from the first curvature.

In other words, the device of the invention is not constituted by a continuous textured surface placed under the cells, but comprises one or more reflective modules placed opposite the gaps separating adjacent cells of the photovoltaic module. Each reflective module comprises a stack of portions, each of the portions having a different curvature allowing all or part of the photons to be directed towards the rear faces of the cells.

Thus, the lost photons coming in particular from light rays falling on the gaps separating the cells reach at least one of the surfaces of the reflective module and are sent back towards the rear face of the cells, significantly increasing the capture of the active rear face of the cells, and therefore the efficiency of the corresponding photovoltaic module.

To advantage, the first and second curvatures are concave, convex or plane.

In a particular embodiment of the invention, the first curvature is convex (relative to the direction of the incident radiation) and the second curvature is plane. For example, the transverse cross-section of the first portion may be hemispherical in form, and that of the second portion may be triangular in form. The base of the first portion is preferably wider than that of the second portion so that the photons falling on the gap separating the cells, reach the first or second portion of the reflective module to be redirected towards the rear face of the cells.

The module may, for example, be made of metal (aluminium, stainless steel), or polymer, such as PMMA.

When the module is made from a non-reflecting material, the surfaces of each of the first and second portions are preferably coated with a reflecting or semi-reflecting material. For example, the reflecting material may be aluminium or silver, or chromium. It is particularly advantageous to obtain reflection above 80% for wavelengths of between 300 and 1200 nanometers.

The reflecting surfaces of the reflective module can be obtained by depositing a layer of chromium or aluminium, this layer then being able to be protected by a layer that is transparent to incident radiation, such as a layer of silica ($SiO_2$).

To advantage, the surfaces of each of the first and second portions of the reflective module may also be coated with a material having a selective optical spectral behaviour. For example, said material may be transparent in respect of infrared rays and reflective in respect of other wavelengths. The advantage of this solution lies in the possibility of filtering some light rays. A multi-layer based on $TiO_2$ and $SiO_2$ may for example be used.

To advantage, the surfaces of the reflective module may also be coated with a material having a bifunctional transparent-reflective behaviour.

According to another embodiment of the invention, the reflective device further comprises a support to which is added the first portion of said reflective module, said support having at least one free zone that is devoid of reflective module, said free zone being coated with a reflecting or semi-reflecting material that can send back all or part of the incident photons towards the rear face of the cells and/or towards at least one of the reflective modules.

In practice, the surfaces of the reflective module may be a mirror and the zones may be coated with a diffusing material.

According to another embodiment of the invention, the reflective device further comprises at least one spacer inserted between said reflective module support and an intermediate plate on which the rear face of the cells rests.

Preferably, said intermediate plate is made from a material that is transparent to all or part of the incident light rays. For example, said intermediate plate may be made of a transparent material such as glass. The spacer may also be coated with a reflecting material.

To advantage, the zone of said support coated by the reflective module is made from a material that can let through all or part of the photons from a light radiation, for example a transparent or semi-transparent material.

In practice, the reflective device comprises a plurality of reflective modules each being intended to be placed in line with a gap separating adjacent cells, the reflective modules resting on said support, and two adjacent reflective modules being separated by a spacer. The surfaces of the reflective module may be coated with a material that has a selective optical spectral behaviour, the support and the intermediate plate may be made from a transparent material such as glass, and the spacer and the free zones may be coated with a reflecting film. For example, each reflective module may be associated with a heat recovery device placed under the support, in order to heat domestic water or the air.

The reflective module may be a section to be placed opposite a gap separating two adjacent rows of photovoltaic cells.

The invention also relates to a photovoltaic module formed by a structure in which is placed a plurality of bifacial photovoltaic cells spaced apart from one another, each cell having an active front face and an active rear face that can capture photons from incident light rays falling on said front and rear faces, said structure being formed by a transparent front plate facing the front faces of the cells, a transparent rear plate facing the rear faces of the cells, and a frame for sealing the front and rear plates. The photovoltaic module according to the invention further comprises a reflective device as described previously.

To advantage, the support on which the first portion of the reflective module rests is formed by the rear plate of the structure.

BRIEF DESCRIPTION OF THE DRAWINGS

Other characteristics and advantages of the invention will become clearer from the description which is given thereof hereinafter, for information purposes and non-restrictively, with reference to the appended drawings, wherein.

DETAILED DISCLOSURE OF EMBODIMENTS OF THE INVENTION

Figure 1:
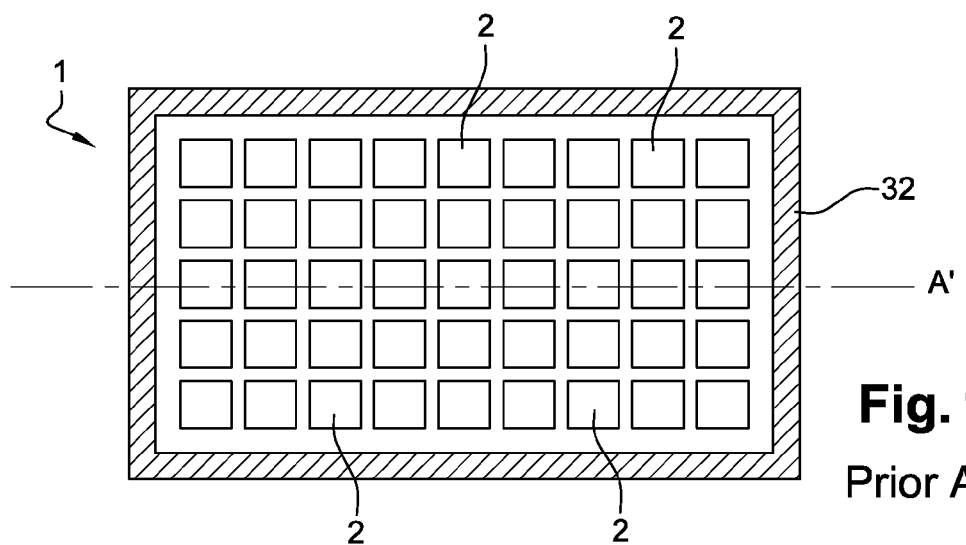
FIG. 1 is a diagrammatic plane view of a photovoltaic module.
Figure 2:
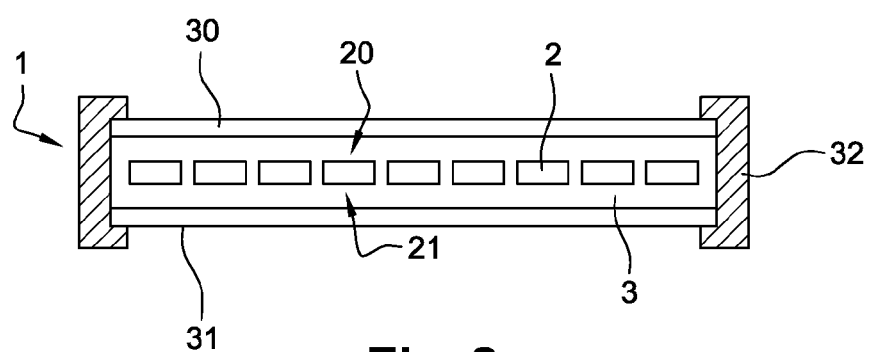
FIG. 2 is a diagrammatic view in cross-section of the photovoltaic module in FIG. 1 implemented along the axis AA'.

A photovoltaic module comprises in particular a plurality of photovoltaic cells 2 placed so as to be spaced apart from one another in a structure 3. Each bifacial cell has an active front face 20 and an active rear face 21, for capturing photons from incident light rays falling on said front 20 and rear 21 faces, and converting them into electricity. The structure 3 is formed from a front plate 30 transparent to incident radiation and placed opposite the front faces 20, a rear plate 31 transparent to the radiation reflected by an appropriate reflective device, and placed opposite the rear faces 21, and a frame 32 for sealing the assembly in order to improve resistance and seal the structure.

Because of the gaps 22 separating the adjacent cells 2, the photons from incident light rays falling on these gaps 22 do not interact with the cells 2, and these photons are therefore lost. In order to send back these lost photons towards the rear face 21 of the cells 2, the photovoltaic module comprises a reflective device which comprises in particular a plurality of reflective modules 4, arranged under the cells 2, and substantially in line with the gaps 22 separating the adjacent cells 2. Each reflective module 4 comprises a stack of two portions 41, 42, each of the portions being able to be coated with a reflecting or semi-reflecting material and having a different curvature so that all or part of the photons can be directed towards the rear face 21 of the cells 2.

Figure 3:
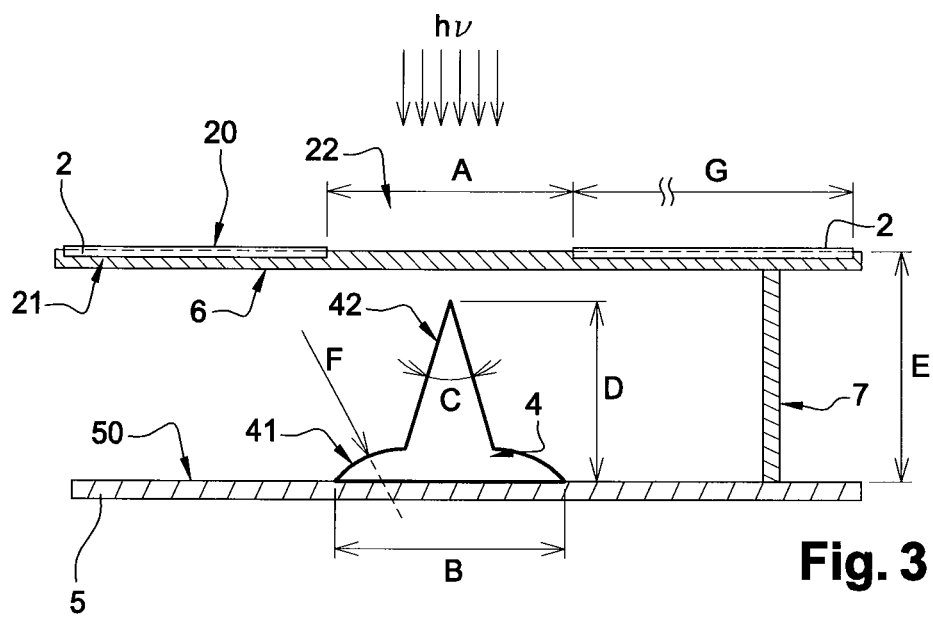
FIG. 3 is a diagrammatic view in partial cross-section of the reflective device built into a photovoltaic module according to a first embodiment of the invention.
Figure 4:
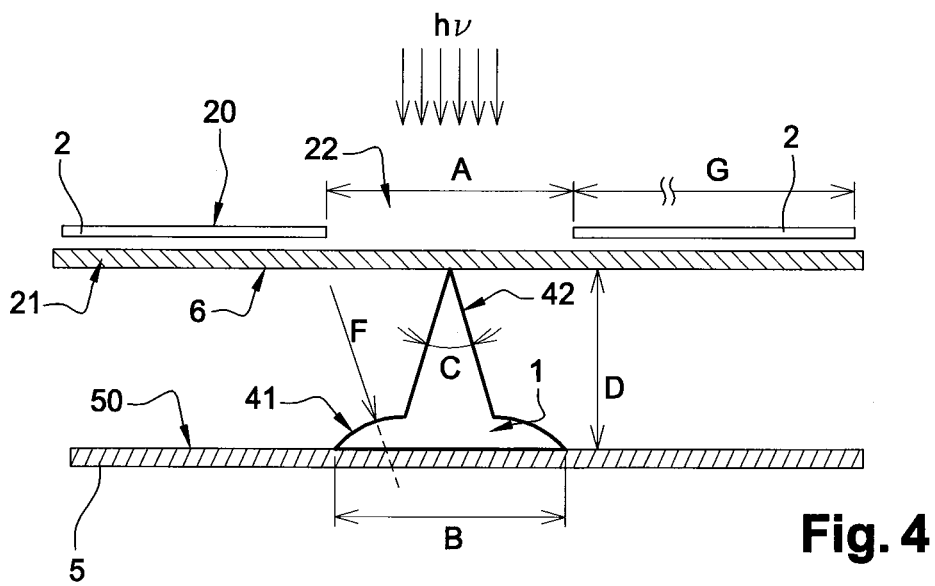
FIG. 4 is a diagrammatic view in partial cross-section of the reflective device built into a photovoltaic module according to a second embodiment of the invention.

As shown in FIGS. 3 and 4, a reflective module 4 comprises in particular:

a first portion 41 of which the surfaces facing the gap 22 have a first curvature such as to send all or part of the incident photons passing through the gap 22 towards the rear face 21 of the cells 2, this curvature also being able to have two centres of curvature, and a second portion 42 mounted on the first portion 41, of which the surfaces facing the gap 22 have a second curvature such as to send all or part of the incident photons towards the rear face 21 of the cells 2, the second curvature being different from the first curvature.

The first curvature may be convex relative to the direction of the incident flux, and the transverse cross-section of the first portion is then in the form of one or two demi-spheres. Additionally, the second curvature may be plane and the transverse cross-section of the second portion is triangular. Clearly, the base of the first portion 41 is preferably wider than that of the second portion so that the photons passing through the gap 22 reach the surfaces of the first and second portions 41, 42 of the reflective module 4 then to be redirected towards the rear face 21 of the cells 2.

The surfaces of each of the first and second portions of the reflective module are coated with a reflecting or semi-reflecting material. For example, the reflecting material may be aluminium, silver or chromium.

Furthermore, the cells 2 are added onto an intermediate plate 6 made from a transparent material such as glass. The reflective modules 4 are for their part added onto a support 5 which may be constituted by the aforementioned rear plate 31 of the structure 3, the reflective modules being in fact positioned between the support 5 and the intermediate plate 6. The support 5 thus has free zones 50 devoid of any reflective module, oriented towards the rear face of the cells 2. To improve the reflection of the lost photons towards the rear faces 21 of the cells 2, these free zones 50 are coated with a reflecting or diffusing material.

Figure 5:
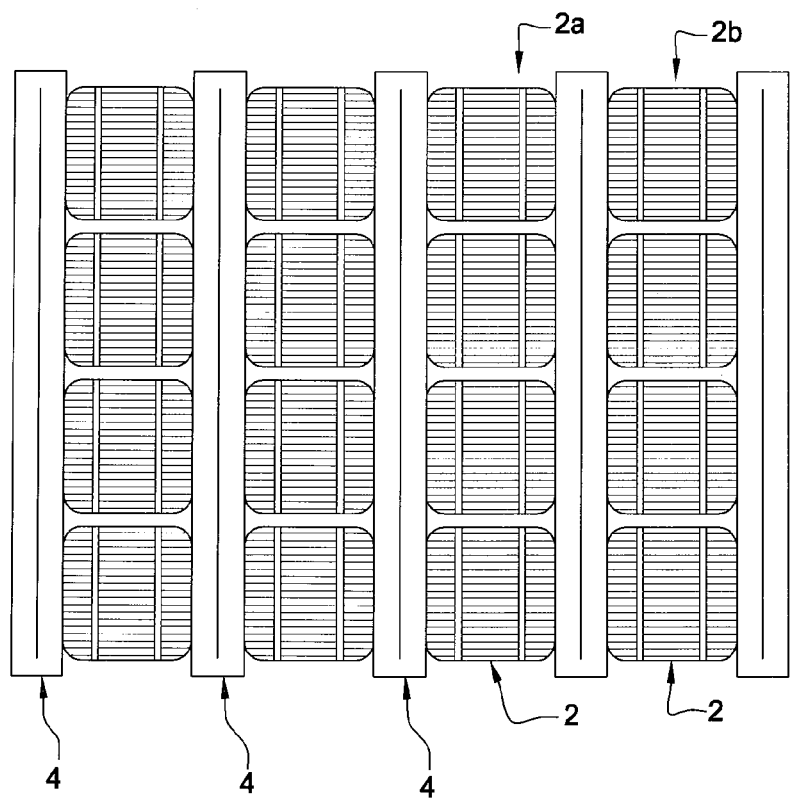
FIG. 5 is a partial diagrammatic view of the front face of a photovoltaic module comprising a reflective device according to another embodiment.

According to one particular embodiment of the invention, each reflective module is in the form of a section, and is placed in line with a gap separating two adjacent rows 2a, 2b of cells 2, as shown in FIG. 5.

Figure 6:
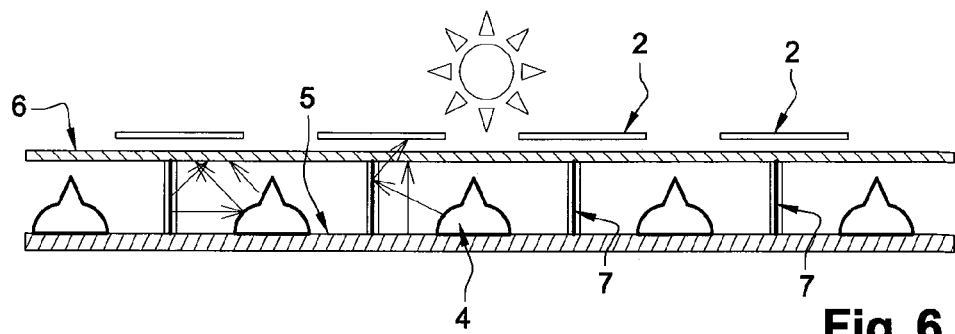
FIG. 6 is a diagrammatic view in cross-section of the photovoltaic module in FIG. 5.

As shown in FIGS. 3 and 6, spacers 7 may be interposed between the intermediate plate 6 and the support 5 to ensure assembly cohesion and mechanical holding. The spacers are preferably placed opposite the rear faces of the cells between two adjacent reflective modules, and coated with a reflecting material. The lost photons are thus reflected on the reflective modules, but also on the spacers and the support, increasing the likelihood of the photons being sent back towards the rear faces of the cells.

As shown in FIG. 4, mechanical holding can also be provided by the reflective modules 4, the intermediate plate 6 resting on the upper part of the second portion of said reflective modules, and then being secured to the edges thereof by mechanical means.

Figure 7:
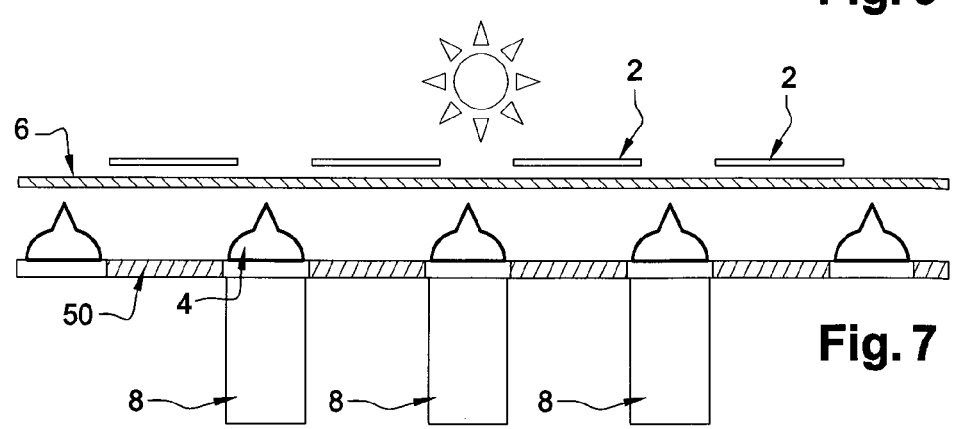
FIG. 7 is a diagrammatic view in cross-section of the photovoltaic module provided with a heat recovery device according to another embodiment of the invention.

According to another embodiment of the invention, and with reference to FIG. 7, the intermediate plate and the support are made from a transparent material such as glass, and the free zones of the support are coated with a reflecting material. Thus, the zones to which the reflective modules are added are transparent, thereby letting through some of the light in order to illuminate a room.

It is also possible to coat the surfaces of each reflective module with a material that has a selective optical spectral behaviour, such as transparent in respect of infrared rays and reflective in respect of the other wavelengths. This filtering is used to associate, with at least some of the reflective modules, heat recovery devices 8 in order to heat water or the air. It is also possible to coat the surfaces with an electrochromic material which has the two functions of transparency and reflection as a function of an applied electric current.

Clearly, the forms of the reflective module are preferably symmetrical in so far as the device addresses at least two cells or rows of juxtaposed cells, and the geometric parameters of the reflective module depend in particular on the architecture of the photovoltaic module and particularly on its size, its thickness, and the gap separating the cells.

By way of example and in the case of a reflective module in accordance with FIGS. 3 and 4, the following characteristics are given:

$0.5G \leq A \leq G$
$G/5 \leq D \leq 0.5G$
$10° \leq C \leq 35°$
$0.5B \leq F \leq 2B$
$A \leq B$ expressions wherein:
A denotes the gap separating the bifacial photovoltaic cells;
B denotes the length of the base of the reflective module,
G is the width of a cell;
C is the angle separating the convergent planes of the upper or second portion of the reflective module;
F is the radius of curvature of the first portion of the reflective module; and
D is the height of the spacer or the gap separating the support and the intermediate plate.

It is clear from what has already been said that the particular structure of the reflective device of the invention means in particular that more lost photons can be sent back towards the rear face of the cells, and as a consequence the performance of the photovoltaic module can be significantly increased, in a straightforward, easily achievable and therefore inexpensive manner. It is thus possible to recover more than 90% of the incident photons.

The solution of the invention also offers the chance to produce a multi-purpose module that is able to provide both electricity and heat via a heat exchanger system.

The invention claimed is:

1. A reflective device for a photovoltaic module formed by a plurality of bifacial photovoltaic cells spaced apart from one another, each bifacial photovoltaic cell having an active front face and an active rear face that can capture photons from incident light rays falling on the front and rear faces, wherein at least one reflective module to be placed under the cells substantially in the spacings separating two adjacent bifacial photovoltaic cells, the at least one reflective module comprising:
a first portion, having a first reflective convex curvature such as to send all or part of the incident photons towards the rear face of the bifacial photovoltaic cells; and
a second portion mounted on the first portion, of which surfaces facing the spacing have a planar reflective surface such as to send all or part of the incident photons towards the rear face of the bifacial photovoltaic cells.

2. The reflective device for a photovoltaic module as claimed in claim 1, wherein the surfaces of each of the first and second portions of the at least one reflective module are coated with a material that is reflecting with respect of incident rays.

3. The reflective device for a photovoltaic module as claimed in claim 1, wherein the surfaces of each of the first and second portions of the at least one reflective module are coated with a material that has a selective optical spectral behavior or a bifunctional transparent-reflective optical behavior.

4. The reflective device for a photovoltaic module as claimed in claim 1, further comprising a support, wherein the first portion is on the support, said support being coated with a reflecting or semi-reflecting material, capable of sending all or part of the incident photons towards the rear face of the bifacial photovoltaic cells and/or towards the at least one reflective module, in areas wherein the at least one reflective module is not present.

5. The reflective device for a photovoltaic module as claimed in claim 4, further comprising at least one spacer inserted between said support of the at least one reflective module and an intermediate plate, wherein the intermediate plate is placed under the bifacial photovoltaic cells, said intermediate plate being made from a material that is transparent to incident rays, and the spacer being coated with a material that is reflecting with respect of said incident rays.

6. The reflective device for a photovoltaic module as claimed in claim 1, wherein the second portion has a triangular transverse cross-section.

7. The reflective device for a photovoltaic module as claimed in claim 5, wherein the at least one reflective module has the following dimensional characteristics:

$0.5G \leq A \leq G$ $G/5 \leq D \leq 0.5G$ $10° \leq C \leq 35°$ $0.5B \leq F \leq 2B$ $A \leq B$ expressions wherein:

A denotes the spacings separating each bifacial photovoltaic cell;

B denotes the length of a base of the at least one reflective module,

G is the width of each bifacial photovoltaic cell;

C is the angle separating the convergent planes of the first portion and the second portion of the at least one reflective module;

F is the radius of curvature of the first portion of the at least one reflective module; and D is the height of the spacer separating the support and the intermediate plate.

8. A photovoltaic module comprising the reflective device of claim 1 and further comprising a front transparent plate opposite the front faces of the bifacial photovoltaic cells, a rear transparent plate opposite the rear faces of the bifacial photovoltaic cells, and a frame for sealing the front and rear plates.

* * * * *